United States Patent
Kirkpatrick

(10) Patent No.: US 7,927,993 B2
(45) Date of Patent: Apr. 19, 2011

(54) CROSS-CONTAMINATION CONTROL FOR SEMICONDUCTOR PROCESS FLOWS HAVING METAL COMPRISING GATE ELECTRODES

(75) Inventor: Brian K. Kirkpatrick, Allen, TX (US)

(73) Assignee: Texas Instruments Incorporated, Dallas, TX (US)

( * ) Notice: Subject to any disclaimer, the term of this patent is extended or adjusted under 35 U.S.C. 154(b) by 305 days.

(21) Appl. No.: 12/344,375

(22) Filed: Dec. 26, 2008

(65) Prior Publication Data
US 2010/0167518 A1 Jul. 1, 2010

(51) Int. Cl.
*H01L 21/3205* (2006.01)
*H01L 21/4763* (2006.01)
*H01L 21/302* (2006.01)
*H01L 21/461* (2006.01)

(52) U.S. Cl. ........ 438/591; 438/752; 438/753; 438/690; 438/691; 257/E21.295; 257/E21.309

(58) Field of Classification Search .................. 438/689, 438/591, 745, 752, 753, 690, 691, 692; 257/E21.295, E21.309
See application file for complete search history.

(56) References Cited

U.S. PATENT DOCUMENTS

| | | |
|---|---|---|
| 4,345,969 A | 8/1982 | James et al. |
| 6,245,677 B1 | 6/2001 | Haq |
| 6,790,786 B2 * | 9/2004 | Morgan et al. ................. 438/754 |
| 7,134,941 B2 * | 11/2006 | Boumerzoug et al. .......... 451/39 |
| 2008/0305633 A1 * | 12/2008 | Itatani et al. ................... 438/686 |

* cited by examiner

*Primary Examiner* — Alexander G Ghyka
*Assistant Examiner* — Seahvosh J Nikmanesh
(74) *Attorney, Agent, or Firm* — Wade J. Brady, III; Frederick J. Telecky, Jr.

(57) ABSTRACT

A method for fabricating a CMOS integrated circuit (IC) includes providing a semiconductor including wafer having a topside semiconductor surface, a bevel semiconductor surface, and a backside semiconductor surface. A gate dielectric layer is formed on at least the topside semiconductor surface. A metal including gate electrode material including at least a first metal is deposited on the gate dielectric layer on the topside semiconductor surface and on at least a portion of the bevel semiconductor surface and at least a portion of the backside semiconductor surface. The metal including gate electrode material on the bevel semiconductor surface and the backside semiconductor surface are selectively removed to form substantially first metal free bevel and backside surfaces while protecting the metal gate electrode material on the topside semiconductor surface. The selective removing includes a first wet etch that etches the metal gate electrode material highly selectively as compared to the semiconductor, wherein the first wet etch includes a strong oxidizing acid, a weak acid that generally include an organic acid, and a fluoride. The fabrication of the IC including is completed including forming at least one metal interconnect layer after the selectively removing step.

22 Claims, 2 Drawing Sheets

CROSS-CONTAMINATION CONTROL FOR SEMICONDUCTOR PROCESS FLOWS HAVING METAL COMPRISING GATE ELECTRODES

BACKGROUND

The present invention relates to semiconductor devices, and, more particularly, to cleaning processes to control contamination from metal comprising gate electrodes and fabrication methods for integrated circuits (ICs).

Conventional methods of creating CMOS devices use gate electrodes comprising polysilicon that is deposited and patterned over a layer of silicon oxide or silicon oxynitride (SiON). Recently, the polysilicon gate electrode has been replaced by a metal comprising gate electrode. As known in the art, the use of a metal as the gate electrode avoids charge depletion in semiconductor comprising electrodes such as polysilicon that limits the effective scaling of the gate electrical thickness.

Gate electrode formation occurs fairly early in the process flow. This early portion of the process flow has historically been without any metal comprising layers. Having all non-metal comprising layers generally allows the same tool to be used for a wide variety of processing steps, without any processing restrictions. However, the introduction of metal comprising gate electrode materials has complicated this situation due to the need to have separate processing tools for processing wafers having metal comprising layers and wafers having all non-metal comprising layers to avoid or at least limit metallic cross-contamination. Dedicated processing tools for wafers having non-metal comprising layers and wafers having metal comprising layers increases final die costs by requiring more processing tools and an increase in required floor space for the added tools.

SUMMARY

This Summary is provided to comply with 37 C.F.R. §1.73, presenting a summary of the invention to briefly indicate the nature and substance of the invention. It is submitted with the understanding that it will not be used to interpret or limit the scope or meaning of the claims.

By removing metal comprising gate electrode materials and related materials (e.g. silicides in the case of silicon comprising substrates) from the back surface, bevel surface and typically an edge exclusion ring of the wafer, the conventional practice of segregating many of the process tools needed in this portion of the process flow can be avoided. A single wafer spray tool having a chemical dispense nozzle with a flipping mechanism can be used for this purpose. This allows reducing the number of processing tools needed, thus significantly reducing die costs by reducing the number of major capital purchases for processing tools and reducing the required floor space for the otherwise required higher number of processing tools.

In a first embodiment of the invention a two-step wet etch process is used. The first wet etch step etches a variety of different metals, while maintaining high selectivity to the exposed semiconductor surface, such as a silicon (Si) or germanium (Ge) surface. The first wet etch step comprises a concentrated strong oxidizing acid such as nitric acid, phosphoric acid, sulfuric acid, a weak acid such as an organic acid, for example; acetic acid, citric acid, oxalic acid and formic acid, and a fluoride such as hydrofluoric acid. As well known in chemistry, a "weak acid" is an acid that dissociates incompletely and does not release all of its hydrogens in a solution, thus not donating all of its hydrogens. Such acids have higher pKa compared to strong acids, which release essentially all of their hydrogens when dissolved in water. An "organic acid" is an organic compound with acidic properties. The weak acid has been found by the Present Inventor to reduce the etch rate of the semiconductor surface (e.g. Si or Ge) at least by a factor of at least 250 as compared to the etch rate of the semiconductor (e.g. Si or Ge) provided by the same etch solution exclusive of the weak acid.

A second wet etch step follows the first etch step and comprises a mixture of nitric acid and a fluoride such as hydrofluoric acid which is used to remove metals and metal/semiconductor arrangements such as silicides in the case the semiconductor comprises silicon from the backside and bevel of the wafer. The second wet etch step is more aggressive as compared to the first etch process and etches the semiconductor at a significantly higher rate as compared to the first wet etch step, but also has the ability to etch metal/semiconductor arrangements, such as metal silicides which can be formed when the metal gate material comes in contact with bare silicon during the metal deposition process.

In a second embodiment of the invention, a passivation layer is formed on the bevel and backside of the wafer before metal gate deposition, such as after the gate dielectric clean which is the last step of the gate dielectric processing. As a result, the metal from the metal deposition processing is kept isolated from the semiconductor surface so that metal/semiconductor arrangements such as silicides are prevented from forming on the backside and bevel surfaces from the metal deposition process. This allows the first wet etch step described above alone to generally remove the metals present on the backside and bevel of the wafer, eliminating the need for the second etch which as noted above can significantly etch the semiconductor such as Si or Ge.

The second embodiment of the invention has been found to generally provide a significant yield enhancement feature. For a conventional state-of-the-art CMOS process, it may be necessary to remove gate metal from the backside and bevel of the wafer up to six (6) times in the process (e.g. for each metal, barrier and gate filler layer for both NMOS and PMOS devices) flow. The metal removal process which generally follows each metal deposition has been found by the Present Inventor to result significant non-uniformities of semiconductor removal on the backside of the wafer, generally resulting in a radial pattern with the removal increasing with radial distance. As a result, the cumulative amount of semiconductor substrate loss on the backside and bevel of the wafer can be both significant and non-uniform. This significant and non-uniform semiconductor consumption on the backside of the wafer has been recognized by the Present Inventor as sometimes resulting in bowing/warping of the wafer sufficient so that photolithography cannot adequately focus across the entire wafer surface. By eliminating the need for an etch that has a high semiconductor etch rate to remove metal from the backside and bevel of the wafer, the second embodiment of the invention can raise yield by reducing the lithography problems described above.

DETAILED DESCRIPTION

Figure 1:
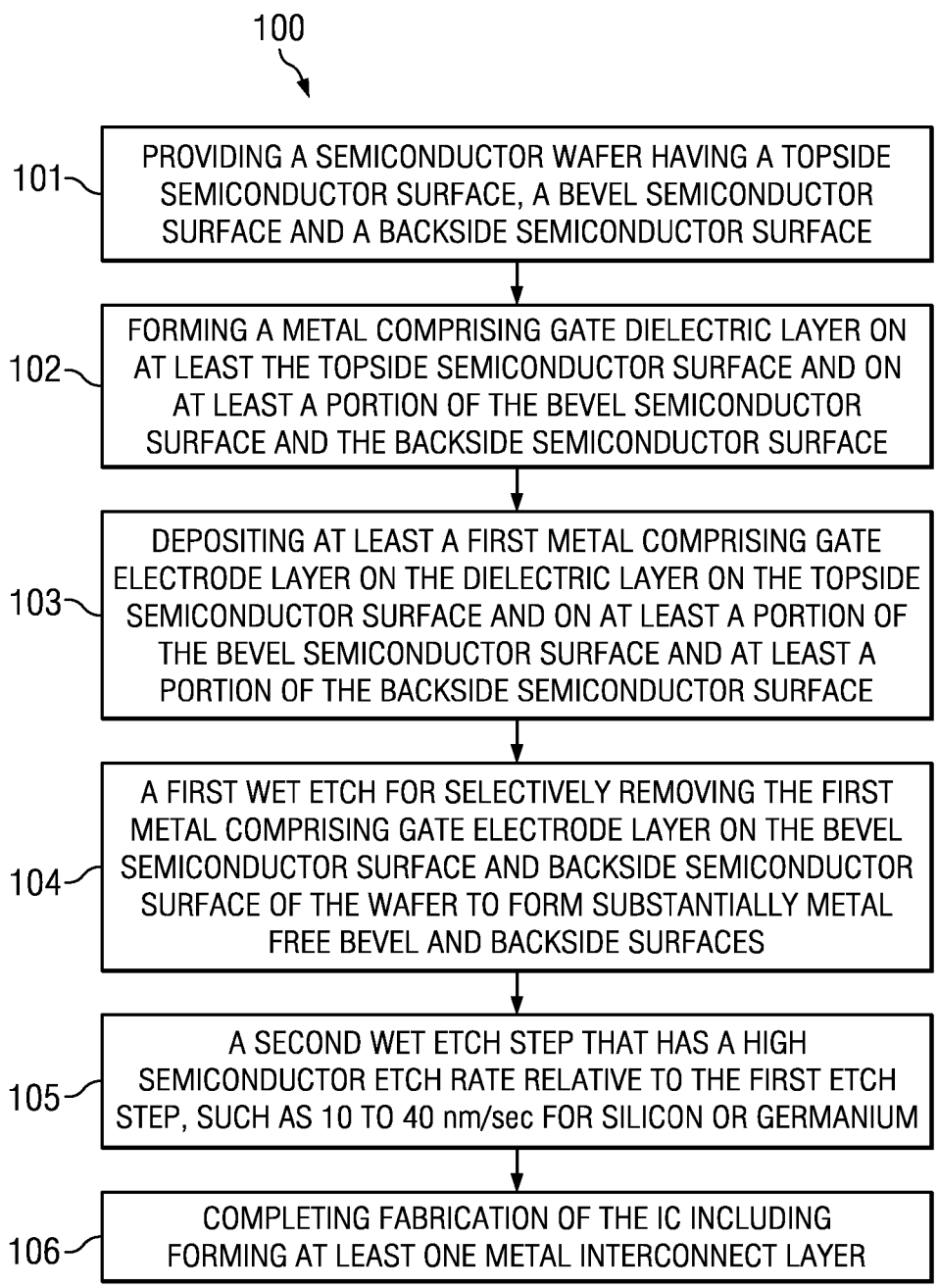
FIG. 1 shows a flow diagram for a first method for fabricating a CMOS integrated circuit (IC) including wet etch processing for removing metals and metal comprising materials from the back semiconductor surface and bevel semiconductor surface of the wafer, according to an embodiment of the invention.

The present invention is described with reference to the attached figures, wherein like reference numerals are used throughout the figures to designate similar or equivalent elements. The figures are not drawn to scale and they are provided merely to illustrate the instant invention. Several aspects of the invention are described below with reference to example applications for illustration. It should be understood that numerous specific details, relationships, and methods are set forth to provide a full understanding of the invention. One having ordinary skill in the relevant art, however, will readily recognize that the invention can be practiced without one or more of the specific details or with other methods. In other instances, well-known structures or operations are not shown in detail to avoid obscuring the invention. The present invention is not limited by the illustrated ordering of acts or events, as some acts may occur in different orders and/or concurrently with other acts or events. Furthermore, not all illustrated acts or events are required to implement a methodology in accordance with the present invention.

FIG. 1 shows a flow diagram for a first method 100 for fabricating a CMOS IC including wet etch processing for removing metals and metal comprising materials from the back surface, bevel and typically the edge exclusion of the wafer, according to an embodiment of the invention. Step 101 comprises providing a semiconductor wafer having a topside semiconductor surface, a bevel semiconductor surface, and a backside semiconductor surface, wherein the topside semiconductor surface, bevel semiconductor surface and backside semiconductor surface generally comprise silicon or germanium. Step 102 comprises forming a gate dielectric layer on at least the topside semiconductor surface. The gate dielectric layer can comprise a high-k dielectric material having a k-value >10. For example, the gate dielectric layer can comprise hafnium oxide, hafnium silicon oxide, hafnium silicon oxynitride, lanthanum oxide, zirconium oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, or lead zinc niobate. The high-k dielectrics can comprise both Hf and Zr.

Step 103 comprises depositing a first metal comprising gate electrode layer on the dielectric layer on the topside semiconductor surface, on at least a portion of the bevel semiconductor surface, and on at least a portion of the backside semiconductor surface. The first metal can comprise at least one refractory metal. As known in the art, the five refractory metals comprise Tungsten (W), Molybdenum (Mo), Niobium (Nb), Tantalum (Ta), and Rhenium (Re). For example, the first metal comprising gate electrode material can comprise the refractory metal itself, such as W, refractory silicides such as $WSi_2$, or electrically conductive refractory metal comprising compounds such as TaN and WN.

Step 104 comprises a first wet etch step which comprises selectively removing the first metal comprising gate electrode layer on the bevel semiconductor surface and backside semiconductor surface of the wafer to form substantially metal free bevel and backside surfaces. As used herein, "substantially metal free" refers to a gate metal concentration of $<1\times10^{10}$ atoms/$cm^2$ while protecting the first metal comprising gate electrode layer on the topside semiconductor surface. In one embodiment, a single wafer spray tool with a flipping mechanism can be used for this purpose. This embodiment avoids the need to add a masking layer that would otherwise generally be needed to protect the metal on the topside of the wafer. An etch selectivity for the first etch step of the first metal comprising gate electrode layer to the semiconductor present on the backside and bevel surfaces is generally >100:1 at 25° C.

The etch solution for the first wet etch step can comprises a concentrated strong oxidizing acid such as nitric acid or phosphoric acid, a weak acid, such as an organic acid, for example acetic acid, citric acid or oxalic acid, and a fluoride. The fluoride can comprise hydrogen fluoride (HF), ammonium fluoride, tetramethylammonium fluoride, ammonium hydrogen fluoride, fluorboric acid or tetramethylammonium tetrafluoroborate.

In one particular embodiment, the strong oxidizing acid comprises nitric acid, the weak acid comprises acetic acid, and the fluoride comprises hydrofluoric acid. In this particular embodiment, a ratio of nitric acid, acetic acid and hydrofluoric acid can be 6.5 to 8.5:4.5 to 6.5:1. As used herein, all ratios provided correspond to volume ratios of concentrated solutions. The exposure time for step 104 is generally 15 to 75 seconds, such as 45 seconds.

Step 105 comprises a second wet etch step that has a high semiconductor etch rate relative to the first etch step, such as 10 to 40 nm/sec for silicon or germanium. The second etch step has been found to have the ability to etch metal/semiconductor arrangements such as metal silicides and metal germanium arrangements which can be formed when the first metal comprising gate electrode layer comes in contact with the exposed semiconductor. In one embodiment of the invention the solution for the second wet etch step consists essentially of nitric acid and a fluoride. In embodiments of the invention where the fluoride is HF, a ratio of nitric acid to HF can be from 100:1 to 200:1. For a 150:1 $HNO_3$:HF mixture, in the case the semiconductor is silicon, the silicon etch rate is generally about 25 nm/sec at 25° C. A typical etch time for the second wet etch step is about 10 to 20 seconds, such as 15 seconds. Step 106 comprises completing fabrication of the IC including forming at least one metal interconnect layer.

Figure 2:
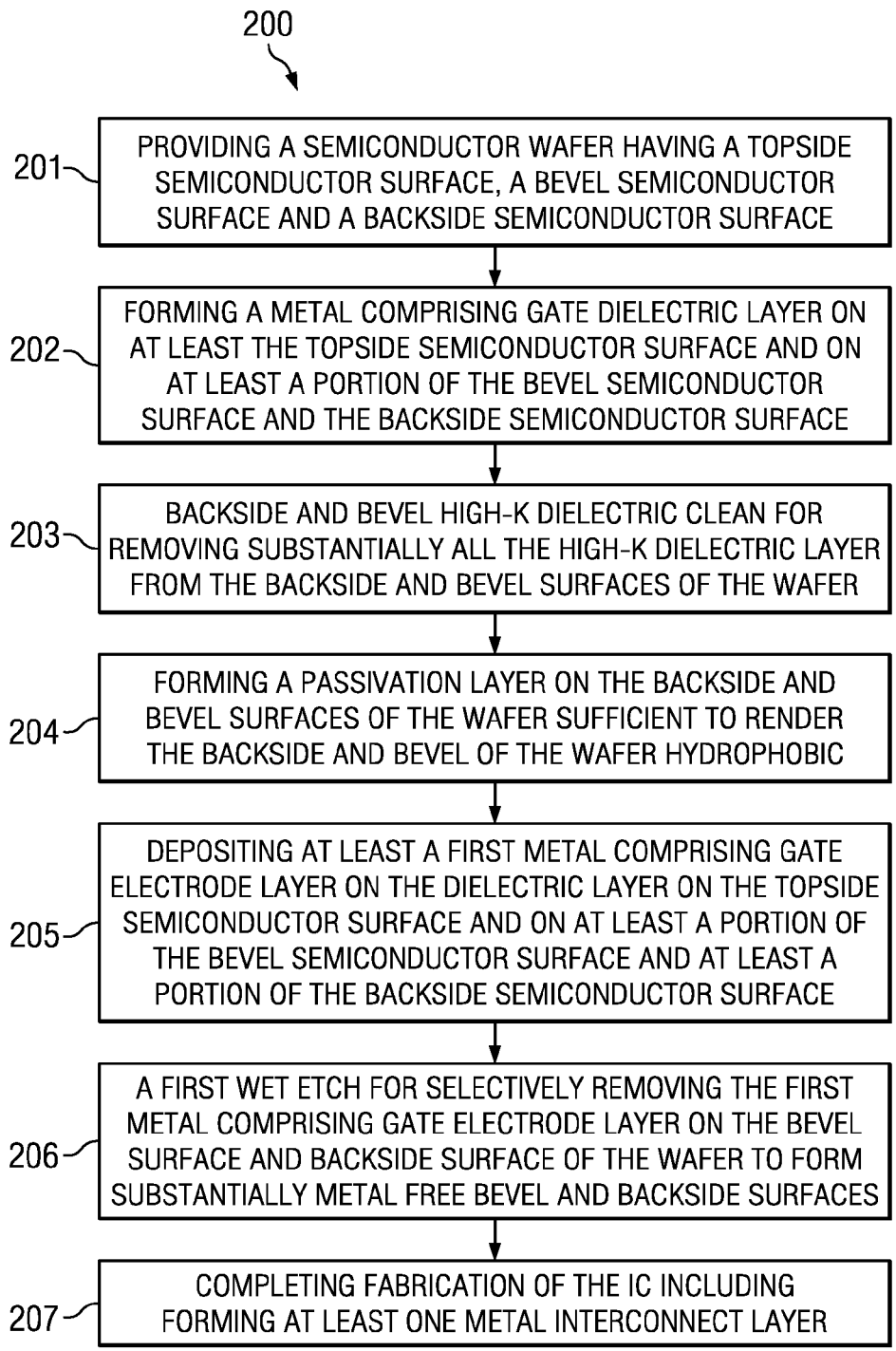
FIG. 2 shows a flow diagram for a second method for fabricating a CMOS IC including passivation layer formation and wet etch processing for removing metals and metal comprising materials from the back semiconductor surface and bevel semiconductor surface of the wafer, according to an embodiment of the invention.

FIG. 2 shows a flow diagram for a second method 200 for fabricating a CMOS IC including passivation layer formation and wet etch processing for removing metals and metal comprising materials from the back semiconductor surface, bevel semiconductor surface, and typically the edge exclusion of the wafer, according to an embodiment of the invention. Method 200 includes steps 101-102 described above for method 100, which are renumbered as steps 201-202, respectively for method 200. Step 203 comprises a backside and bevel high-k dielectric clean. A single wafer spray tool with a flipping mechanism can be used for this purpose to eliminate the need to protect the frontside of the wafer. The backside and bevel high-k dielectric clean removes substantially all the high-k dielectric layer from the backside and bevel surfaces of the wafer.

Step 204 comprises forming a passivation layer on the backside and bevel surfaces of the wafer sufficient to render the backside and bevel of the wafer hydrophobic. As known in the art, a hydrophobic surface beads off water on its surface. The passivation layer can be formed using a variety of methods. One method comprises an oxidizing furnace or a plasma furnace, such as an asher operated using an oxidizing plasma. Another method comprises an oxidizing solution for growing a silicon oxide layer on the backside and bevel of the wafer. A single wafer spray tool with a flipping mechanism can be used for this purpose to eliminate the need to protect the frontside of the wafer. Yet another method comprises forming a room temperature or near room temperature relatively thick "native oxide" layer in the ambient air by allowing the native oxide to grow for ≧12 hours. The resulting silicon oxide layer in the case of a silicon substrate is a low density silicon oxide layer that is generally at least 10 to 15 Angstroms thick, which compares to a conventional native oxide layer that is generally results from several hours (e.g. portion of a shift) that is no more than about 8 Angstroms thick, such as 6 to 8 Angstroms thick.

Step 205 is analogous to step 103 described above for method 100. Step 205 comprises depositing a metal comprising at least one gate electrode material including at least a first metal on the dielectric layer on the topside semiconductor surface and on at least a portion of the bevel surface and at least a portion of the backside surface. Due to the presence of the passivation layer formed in step 204, semiconductor metal assemblies (e.g. metal silicides) do not generally form on the backside and the bevel of the wafer during metal deposition since the passivation layer protects the semiconductor surface.

Step 206 is based on the same chemistry as step 104 described relative to method 100 and comprises a first wet etch step which selectively removes the first metal comprising gate electrode layer on the bevel surface and backside surface of the wafer to form substantially metal free bevel and backside surfaces. The time for step 206 may be longer, such as 15 to 90 seconds, as compared to the exposure time for step 104 described above. An increased exposure time allows for sufficient overetch to generally fully remove metal from the backside and bevel of the wafer without having to use a second etch step that has a high semiconductor etch rate that is analogous to step 105 described above relative to method 100 since metal semiconductor arrangements such as metal silicides are generally not present on the backside and bevel of the wafer due to the presence of the passivation layer. By eliminating the need for the second wet etch step which has a high semiconductor etch rate analogous to step 105, semiconductor loss on the backside and bevel of the wafer is generally reduced by a factor of more than 250. Step 207 comprises completing fabrication of the IC including forming at least one metal interconnect layer.

Example

The following non-limiting Example serves to illustrate selected embodiments of the invention. It will be appreciated that variations in proportions and alternatives in elements of the components shown will be apparent to those skilled in the art and are within the scope of embodiments of the present invention.

A method analogous to method 100 described above was tested on 300 mm Si wafers including wafers having a thermally grown gate oxide thickness of 8 to 15 Angstroms, and wafers having a chemically grown oxide approximately 8 to 15 Angstroms thick. A 10 nm thick layer of W was deposited on the wafers including on the backside and bevel surfaces. The first wet etch step comprised 10:7:1.3 $HNO_3$:Acetic acid: HF solution for 45 seconds and the second wet etch step comprised a 150:1 $HNO_3$:HF solution for 15 seconds. VPD-DC-ICP-MS and TXRF were used to quantify the residual W concentration on the backside of the wafers. TXRF refers to Totally-reflected X-ray Fluorescence VPD-DC-ICPMS refers to Vapor Phase Decomposition-Droplet Collection-Inductively Coupled Mass Spectroscopy. All wafers tested evidenced a residual W concentration of $<1 \times 10^{10}$ atoms/cm$^2$, which is the front end of the line (FEOL) specification. Similar tests were performed using 50 nm thick W films with residual W concentration of $<1 \times 10^{10}$ atoms/cm$^2$ results again being achieved.

A method analogous to method 200 described above was tested on 300 mm Si wafers having a chemically grown oxide estimated at about 8 to 15 Angstroms formed using a spray etch tool having wafer flipping according to an embodiment of the invention. On the chemically grown oxide a 10 nm thick layer of W was deposited on some wafers and TaN on other wafers. Some wafers were exposed to a single first wet clean step comprising 10:7:1.3 $HNO_3$:Acetic acid:HF for 45 or 60 seconds and other wafers were exposed to the first wet clean step and a second wet clean step comprising 150:1 $HNO_3$:HF for 60 seconds according to an embodiment of the invention. In all cases the W or TaN levels was found to be below the $1 \times 10^{10}$ atoms/cm$^2$ FEOL specification. It was thus concluded that if the metal film is deposited onto a passivated surface, 60 sec of a single first wet clean step such as 10:7:1.3 $HNO_3$: Acetic acid:HF was sufficient to remove 10 nm of W or TaN and reduce the residual metal concentration on the backside and bevel of the wafer to a level below the $1 \times 10^{10}$ atoms/cm$^2$ FEOL specification.

While various embodiments of the present invention have been described above, it should be understood that they have been presented by way of example only, and not limitation. Numerous changes to the disclosed embodiments can be made in accordance with the disclosure herein without departing from the spirit or scope of the invention. Thus, the breadth and scope of the present invention should not be limited by any of the above described embodiments. Rather, the scope of the invention should be defined in accordance with the following claims and their equivalents.

Although the invention has been illustrated and described with respect to one or more implementations, equivalent alterations and modifications will occur to others skilled in the art upon the reading and understanding of this specification and the annexed drawings. In addition, while a particular feature of the invention may have been disclosed with respect to only one of several implementations, such feature may be combined with one or more other features of the other implementations as may be desired and advantageous for any given or particular application.

The terminology used herein is for the purpose of describing particular embodiments only and is not intended to be limiting of the invention. As used herein, the singular forms "a", "an" and "the" are intended to include the plural forms as well, unless the context clearly indicates otherwise. Furthermore, to the extent that the terms "including", "includes", "having", "has", "with", or variants thereof are used in either the detailed description and/or the claims, such terms are intended to be inclusive in a manner similar to the term "comprising."

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

The Abstract of the Disclosure is provided to comply with 37 C.F.R. §1.72(b), requiring an abstract that will allow the reader to quickly ascertain the nature of the technical disclosure. It is submitted with the understanding that it will not be used to interpret or limit the scope or meaning of the following claims.

What is claimed is:

1. A method for fabricating a CMOS integrated circuit (IC), comprising:
   providing a semiconductor comprising wafer having a topside semiconductor surface, a bevel semiconductor surface, and a backside semiconductor surface;
   forming a gate dielectric layer on at least said topside semiconductor surface;
   depositing a metal comprising gate electrode material including at least a first metal on said dielectric layer on said topside semiconductor surface and on at least a portion of said bevel semiconductor surface and at least a portion of said backside semiconductor surface;
   selectively removing said metal comprising gate electrode material on said bevel semiconductor surface and said backside semiconductor surface to form substantially first metal free bevel and backside surfaces while protecting said metal comprising gate electrode material on said topside semiconductor surface, said selective removing comprising:
   a first wet etch that etches said metal comprising gate electrode material highly selectively as compared to said bevel semiconductor surface and said backside semiconductor surface, said first wet etch comprising a strong oxidizing acid, a weak acid and a fluoride, and
   completing fabrication of said IC including forming at least one metal interconnect layer after said selectively removing step.

2. The method of claim 1, wherein said bevel semiconductor surface and said backside semiconductor surface comprise silicon or germanium.

3. The method of claim 1, wherein said topside semiconductor surface, said bevel semiconductor surface, and said backside semiconductor surface each comprise silicon and an etch selectivity of said first wet etch of said metal comprising gate electrode material to said bevel semiconductor surface and said backside conductor surface is >100:1.

4. The method of claim 1, wherein a single wafer spray etch tool having wafer flipping is used for said selective removing.

5. The method of claim 1, wherein said first metal comprises at least one refractory metal.

6. The method of claim 5, wherein said refractory metal comprises W or Ta.

7. The method of claim 1, wherein said strong oxidizing acid comprises nitric acid or phosphoric acid.

8. The method of claim 1, wherein said weak acid comprises an organic acid.

9. The method of claim 8, wherein said organic acid comprises acetic acid, citric acid or oxalic acid.

10. The method of claim 1, further comprising a second wet etch different from said first wet etch that etches both said bevel semiconductor surface and said backside semiconductor surface and first metal semiconductor arrangements comprising said first metal following said first wet etch.

11. The method of claim 10, wherein said second wet etch comprises nitric acid and a fluoride.

12. The method of claim 1, further comprising the step of forming a passivation layer after said forming said gate dielectric layer and before said depositing said metal comprising gate electrode material.

13. The method of claim 12, wherein said forming said passivation layer comprises oxidizing furnace or plasma furnace processing.

14. The method of claim 12, wherein said forming said passivation layer comprises an oxidizing solution for growing a silicon oxide layer on said backside semiconductor surface and said bevel semiconductor surface.

15. The method of claim 12, wherein said forming said passivation layer comprises forming a room temperature or near room temperature oxide layer on said backside semiconductor surface and said bevel semiconductor surface in ambient air for $\geq 12$ hours.

16. The method of claim 1, wherein said gate dielectric layer comprises a high-k dielectric material having a k-value >10.

17. The method of claim 16, wherein said high-k dielectric material comprises hafnium oxide, hafnium silicon oxide, hafnium silicon oxynitride, lanthanum oxide, zirconium oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, or lead zinc niobate.

18. A method for fabricating a CMOS integrated circuit (IC), comprising:
   providing a silicon comprising wafer having a topside silicon surface, a bevel silicon surface, and a backside silicon surface;
   forming a high-k gate dielectric layer on at least said topside silicon surface;
   depositing a metal comprising gate electrode material including at least a first metal on said high-k dielectric layer on said topside silicon surface and on at least a portion of said bevel silicon surface and at least a portion of said backside silicon surface;
   selectively removing said metal comprising gate electrode material on said bevel silicon surface and said backside silicon surface using a single wafer spray etch tool having wafer flipping to form substantially first metal free bevel and backside surfaces while protecting said metal comprising gate electrode material on said topside semiconductor surface, said selective removing comprising:
   a first wet etch that etches said metal comprising gate electrode material highly selectively as compared to said bevel silicon surface and said backside silicon surface silicon, said first wet etch comprising nitric acid, an organic acid and a hydrofluoric acid, and
   completing fabrication of said IC including forming at least one metal interconnect layer after said selectively removing step.

19. The method of claim 18, wherein said organic acid comprises acetic acid and a ratio of said nitric acid, said organic acid and said hydrofluoric acid is 6.5 to 8.5:4.5 to 6.5:1.

20. The method of claim 18, further comprising a second wet etch different from said first wet etch that etches both said bevel silicon surface and said backside silicon surface and first metal silicon arrangements comprising said first metal following said first wet etch, wherein said second wet etch consists essentially of said nitric acid and hydrofluoric acid, wherein a ratio of said nitric acid to said hydrofluoric acid is from 100:1 to 200:1.

21. The method of claim 18, further comprising the step of forming a passivation layer after said forming said high-k gate dielectric layer and before said depositing said metal comprising gate electrode material, wherein said forming said passivation layer comprises an oxidizing solution for growing a silicon oxide layer on said backside silicon surface and said bevel silicon surface.

22. The method of claim 18, wherein said first metal comprises W or Ta.

* * * * *